(12) United States Patent
Wieczorek et al.

(10) Patent No.: US 7,217,657 B2
(45) Date of Patent: May 15, 2007

(54) SEMICONDUCTOR DEVICE HAVING DIFFERENT METAL SILICIDE PORTIONS AND METHOD FOR FABRICATING THE SEMICONDUCTOR DEVICE

(75) Inventors: Karsten Wieczorek, Dresden (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/260,926

(22) Filed: Sep. 30, 2002

(65) Prior Publication Data

US 2003/0160198 A1 Aug. 28, 2003

(30) Foreign Application Priority Data

Feb. 28, 2002 (DE) ................. 102 08 728

(51) Int. Cl.
*H01L 21/44* (2006.01)
(52) U.S. Cl. ............... 438/664; 438/655; 438/682; 438/683
(58) Field of Classification Search ........... 257/288, 257/382, 385, 412, 413, 757, 763, 761, 769, 257/770; 438/660, 663, 664, 682, 684, 683, 438/685, 686, 655
See application file for complete search history.

(56) References Cited

U.S. PATENT DOCUMENTS

| | | | | |
|---|---|---|---|---|
| 3,840,982 A | * | 10/1974 | Schuster et al. | 438/614 |
| 3,912,559 A | | 10/1975 | Harigaya et al. | 148/187 |
| 3,945,347 A | * | 3/1976 | Takemoto et al. | 438/542 |
| 4,107,835 A | | 8/1978 | Bindell et al. | 29/590 |
| 4,897,368 A | | 1/1990 | Kobushi et al. | 437/200 |
| 5,034,348 A | | 7/1991 | Hartswick et al. | 437/200 |
| 5,248,892 A | | 9/1993 | Van Roozendaal et al. | 257/357 |

(Continued)

FOREIGN PATENT DOCUMENTS

DE 19520782 A1 12/1995

(Continued)

OTHER PUBLICATIONS

Stanley Wolf and Richard N. Tauber, "Silicon Processing for the VLSI Era, vol. 1: Process Technology," Lattice Press, Sunset Beach, CA, (1986), p. 518.*

(Continued)

*Primary Examiner*—Ori Nadav
(74) *Attorney, Agent, or Firm*—Williams, Morgan & Amerson

(57) ABSTRACT

A method is disclosed in which differing metal layers are sequentially deposited on silicon-containing regions so that the type and thickness of the metal layers may be adapted to specific characteristics of the underlying silicon-containing regions. Subsequently, a heat treatment is performed to convert the metals into metal silicides so as to improve the electrical conductivity of the silicon-containing regions. In this way, silicide portions may be formed that are individually adapted to specific silicon-containing regions so that device performance of individual semiconductor elements or the overall performance of a plurality of semiconductor elements may be significantly improved. Moreover, a semiconductor device is disclosed comprising at least two silicon-containing regions having formed therein differing silicide portions, wherein at least one silicide portion comprises a noble metal.

23 Claims, 4 Drawing Sheets

U.S. PATENT DOCUMENTS

| | | | |
|---|---|---|---|
| 5,316,977 A | 5/1994 | Kunishima et al. | 437/200 |
| 5,317,187 A | 5/1994 | Hindman et al. | 257/659 |
| 5,352,631 A | 10/1994 | Sitaram et al. | 437/200 |
| 5,447,875 A | 9/1995 | Moslehi | 437/41 |
| 5,451,545 A | 9/1995 | Ramaswami et al. | 437/200 |
| 5,565,708 A | 10/1996 | Ohsaki et al. | 257/764 |
| 5,738,917 A | 4/1998 | Besser et al. | 427/576 |
| 5,766,997 A | 6/1998 | Takeuchi | 438/257 |
| 5,814,537 A * | 9/1998 | Maa et al. | 438/151 |
| 5,851,891 A | 12/1998 | Dawson et al. | 438/305 |
| 5,874,342 A | 2/1999 | Tsai et al. | 438/301 |
| 5,899,720 A | 5/1999 | Mikagi | 438/303 |
| 5,902,129 A | 5/1999 | Yoshikawa et al. | 438/592 |
| 5,908,309 A | 6/1999 | Andoh | 438/231 |
| 5,937,325 A | 8/1999 | Ishida | 438/655 |
| 5,998,252 A | 12/1999 | Huang | 438/241 |
| 6,020,242 A * | 2/2000 | Tsai et al. | 438/279 |
| 6,040,606 A | 3/2000 | Blair | 257/364 |
| 6,063,681 A | 5/2000 | Son | 438/303 |
| 6,072,222 A | 6/2000 | Nistler | 257/383 |
| 6,100,173 A | 8/2000 | Gardner et al. | 438/592 |
| 6,103,610 A | 8/2000 | Blair | 438/592 |
| 6,133,130 A | 10/2000 | Lin et al. | 438/586 |
| 6,136,705 A | 10/2000 | Blair | 438/682 |
| 6,177,319 B1 | 1/2001 | Chen | 438/275 |
| 6,187,617 B1 | 2/2001 | Gauthier, Jr. et al. | 438/197 |
| 6,204,103 B1 | 3/2001 | Bai et al. | 438/224 |
| 6,232,227 B1 * | 5/2001 | Mikagi | 438/655 |
| 6,238,984 B1 | 5/2001 | Yang | 438/275 |
| 6,238,986 B1 | 5/2001 | Kepler et al. | 438/301 |
| 6,261,898 B1 | 7/2001 | Wu | 438/241 |
| 6,268,255 B1 | 7/2001 | Besser et al. | 438/303 |
| 6,268,257 B1 | 7/2001 | Wieczorek et al. | 438/305 |
| 6,281,067 B1 | 8/2001 | Chien et al. | 438/241 |
| 6,297,135 B1 | 10/2001 | Talwar et al. | 438/592 |
| 6,306,698 B1 | 10/2001 | Wieczorek et al. | 438/197 |
| 6,383,878 B1 | 5/2002 | Huang | 438/299 |
| 6,383,906 B1 | 5/2002 | Wieczorek et al. | 438/592 |
| 6,391,704 B1 | 5/2002 | Hong et al. | 438/241 |
| 6,403,423 B1 | 6/2002 | Weybright et al. | 438/279 |
| 6,451,679 B1 | 9/2002 | Hu et al. | 438/592 |
| 6,468,904 B1 | 10/2002 | Chen et al. | 438/682 |
| 6,528,401 B2 | 3/2003 | Bae et al. | 438/592 |
| 6,528,422 B1 | 3/2003 | Huang et al. | 438/683 |
| 6,531,724 B1 | 3/2003 | Furukawa et al. | 257/288 |
| 6,534,402 B1 | 3/2003 | Liao | 438/659 |
| 6,544,876 B1 | 4/2003 | Iyer | 438/592 |
| 6,583,038 B2 * | 6/2003 | Hu | 438/592 |
| 6,686,276 B2 * | 2/2004 | Edrei et al. | 438/655 |
| 2002/0008261 A1 | 1/2002 | Nishiyama | 257/288 |

FOREIGN PATENT DOCUMENTS

| | | |
|---|---|---|
| DE | 198 19 438 A1 | 3/1999 |
| DE | 199 52 177 A1 | 5/2000 |
| DE | 19952177 A1 | 5/2000 |
| EP | 0 199 939 A2 | 12/1986 |
| EP | 0 417 522 A2 | 3/1991 |
| EP | 0 727 815 A1 | 9/1996 |
| JP | 63157465 A | 8/1988 |
| JP | 05055251 A | 3/1993 |
| JP | 11-40679 | 2/1999 |
| JP | 2002025940 A | 1/2002 |
| WO | WO 95/15005 | 6/1995 |
| WO | WO 96/13061 | 5/1996 |
| WO | WO02/065523 A1 | 8/2002 |

OTHER PUBLICATIONS

Stanley Wolf, "Silicon Processing for the VLSI Era, vol. 2: Process Integration," Lattice Press, Sunset Beach, CA (1990), p. 1.*

Donald M. Mattox, "Handbook of Physical Vapor Deposition (PVD) Processing," Noyes Publ., Park Ridge, New Jersey, (1998), pp. 265,326,336.*

D.S. Bang, J.P. McVittie, M.M. Islamraja, K.C. Saraswat, Z. Krivokapic, and R. Cheung, "Modeling of Ti Physical Vapor Deposition System," Proc. Int'l Workshop on Numerical Modeling of Proc. and Devices for IC's (1994), pp. 41-44.*

U.S. Appl. No. 10/259,016, entitled "Semiconductor Device Having Different Metal-Semiconductor Portions Formed in a Semiconductor Region and a Method for Fabricating the Semiconductor Device," filed Sep. 27, 2002.

U.S. Appl. No. 10/282,720, entitled "Method of Forming Different Silicide Portions on Different Silicon-Containing Regions in a Semiconductor Device," filed Oct. 29, 2002.

* cited by examiner

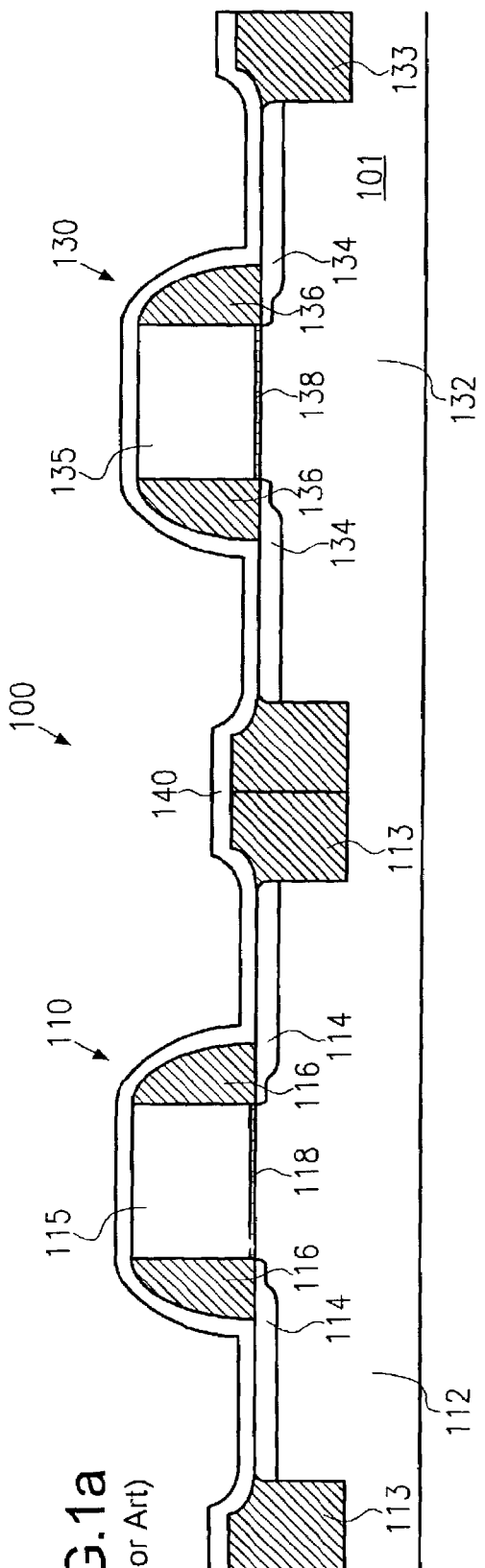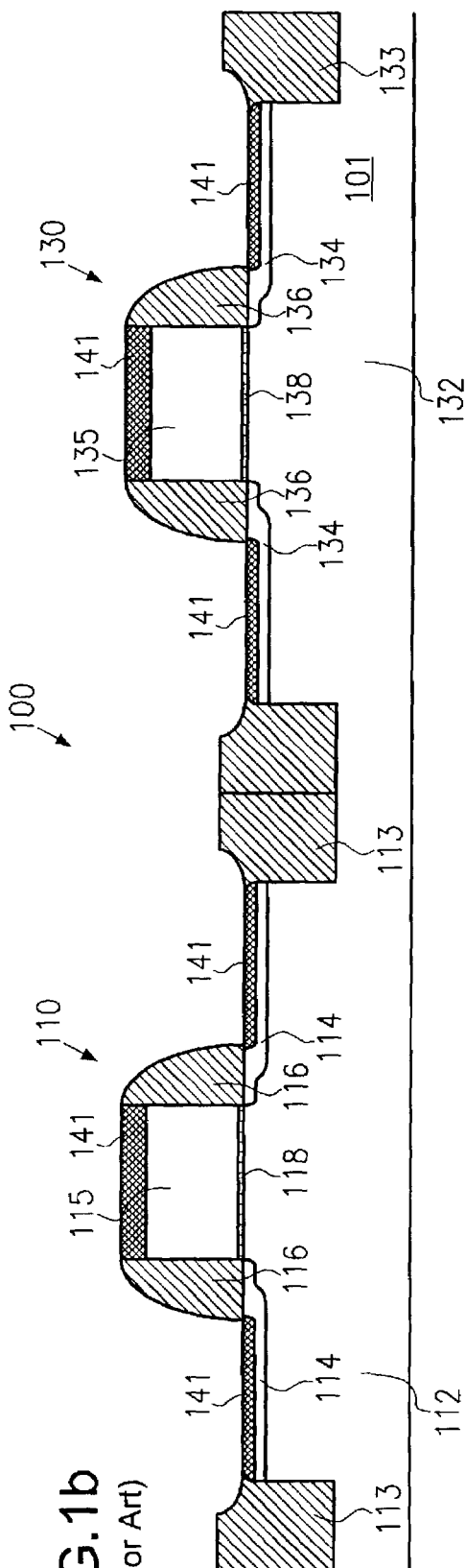
FIG. 1a (Prior Art)
FIG. 1b (Prior Art)

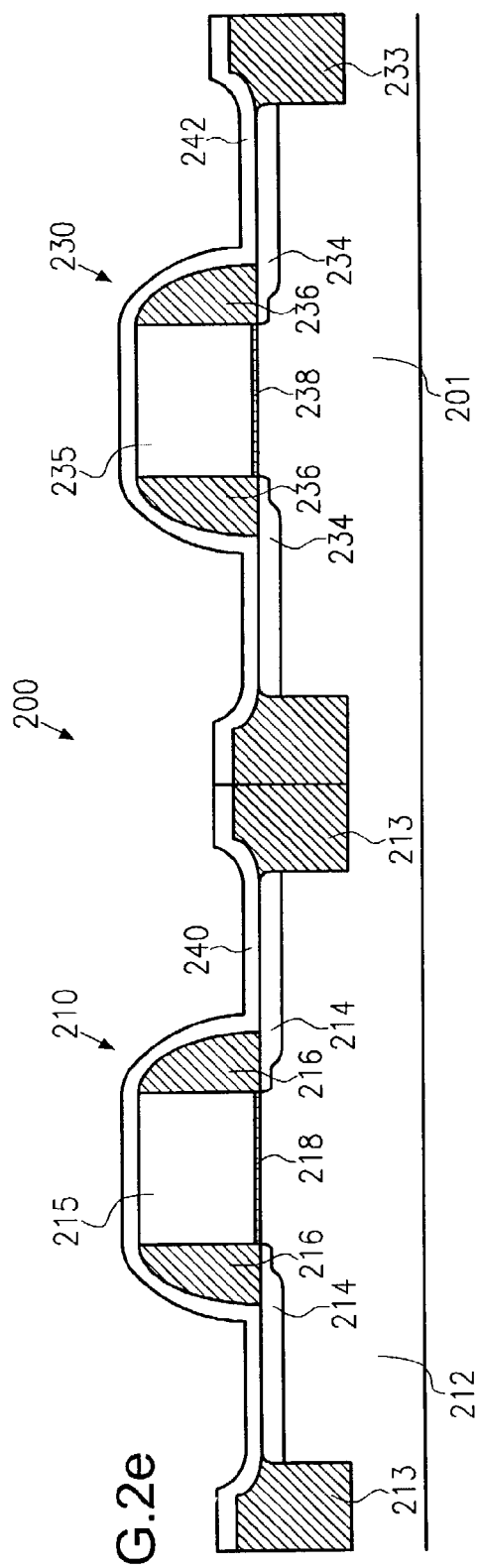
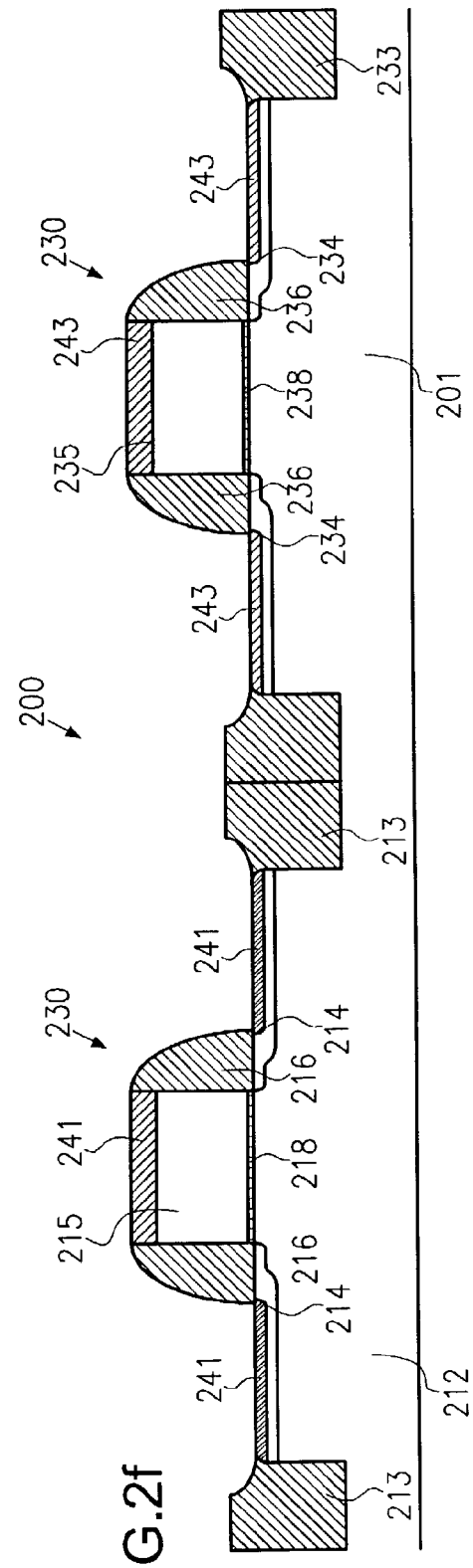

SEMICONDUCTOR DEVICE HAVING DIFFERENT METAL SILICIDE PORTIONS AND METHOD FOR FABRICATING THE SEMICONDUCTOR DEVICE

BACKGROUND OF THE INVENTION

1. Field of the Invention

Generally, the present invention relates to the field of fabrication of integrated circuits, and, more particularly, to semiconductor devices having metal-silicide portions on semiconductor regions to reduce the sheet resistance of the semiconductor regions. Furthermore, the present invention relates to a method of manufacturing these semiconductor devices.

2. Description of the Related Art

In modem ultra-high density integrated circuits, device features are steadily decreasing to enhance device performance and functionality. Shrinking the feature sizes, however, entails certain problems that may partially offset the advantages obtained by the reduced feature sizes. Generally, reducing the feature sizes of, for example, a transistor element, leads to a decreased channel resistance in the transistor element and thus results in a higher drive current capability and enhanced switching speed of the transistor. In decreasing the features sizes of these transistor elements, however, the increasing electrical resistance of conductive lines and contact regions, i.e., of regions that provide electrical contact to the periphery of the transistor element, becomes a dominant issue since the cross-sectional area of these lines and regions decreases with decreasing feature sizes. The cross-sectional area, however, determines, in combination with the characteristics of the material comprising the conductive lines and contact regions, the resistance of the respective line or contact region.

The above problems may be exemplified for a typical critical feature size in this respect, also referred to as a critical dimension (CD), such as the extension of the channel of a field effect transistor that forms below a gate electrode between a source region and a drain region of the transistor. Reducing this extension of the channel, commonly referred to as channel length, may significantly improve device performance with respect to fall and rise times of the transistor element due to the smaller capacitance between the gate electrode and the channel and due to the decreased resistance of the shorter channel. Shrinking of the channel length, however, also entails the reduction in size of any conductive lines, such as the gate electrode of the field effect transistor, which is commonly formed of polysilicon, and the contact regions that allow electrical contact to the drain and source regions of the transistor, so that consequently the available cross-section for charge carrier transportation is reduced. As a result, the conductive lines and contact regions exhibit a higher resistance unless the reduced cross-section is compensated by improving the electrical characteristics of the material forming the lines and contact regions, such as the gate electrode, and the drain and source contact regions.

It is thus of particular importance to improve the characteristics of conductive regions that are substantially comprised of semiconductor material such as silicon. For instance, in modem integrated circuits, the individual semiconductor devices, such as field effect transistors, capacitors and the like, are primarily based on silicon, wherein the individual devices are connected by silicon lines and metal lines. While the resistivity of the metal lines may be improved by replacing the commonly used aluminium by, for example, copper, process engineers are confronted with a challenging task when an improvement in the electrical characteristics of silicon-containing semiconductor lines and semiconductor contact regions is required.

With reference to FIGS. 1a and 1b, an exemplary process for manufacturing an integrated circuit containing, for example, a plurality of MOS transistors, will now be described in order to illustrate the problems involved in improving the electrical characteristics of silicon-containing semiconductor regions in more detail.

In FIG. 1a, a semiconductor structure 100 includes a substrate 101, for example, a silicon substrate, in which a first semiconductor element 110 and a second semiconductor element 130 are formed. The first semiconductor element 110 may, as depicted in FIG. 1a, represent a field effect transistor of a first conductivity type, such as an n-channel transistor, and the second semiconductor element 130 may represent a field effect transistor of a second conductivity type, such as a p-channel transistor. The first semiconductor element 110 comprises shallow trench isolations (STI) 113 that are formed of an insulated material, such as silicon dioxide, and that define an active region 112 in the substrate 101. A gate electrode 115 is formed over a gate insulation layer 118 that separates the gate electrode 115 from the active region 112. Spacer elements 116 made of, for example, silicon dioxide or silicon nitride, are located at the sidewalls of the gate electrode 115. In the active region 112, source and drain regions 114 are formed and exhibit an appropriate dopant profile required to connect to a conductive channel that builds up between the drain and the source region during operation of the first semiconductor element 110.

The second semiconductor element 130 comprises substantially the same parts as the first semiconductor element 110 and corresponding parts are denoted by the same reference numerals except for a "leading 13" instead of a "leading 11." As previously noted, the second semiconductor element 130 may differ from the first semiconductor element 110 in, for example, type of conductivity, that is, type and concentration of dopants provided in the active regions 112 and 132, lateral extension of the gate electrode, also referred to as gate length, cross-sectional area, and the like. Moreover, it should be noted that although the first and second semiconductor elements 110 and 130 in FIGS. 1a and 1b are depicted as transistor elements, the first and second semiconductor elements 110 and 130 may represent any silicon-containing region that is used for charge carrier transportation. For example, relatively long polysilicon lines may connect semiconductor elements on different locations of a single chip area and these polysilicon lines may be regarded as first and second semiconductor elements 110, 130, the electrical characteristics of which are to be improved so as to obtain an enhanced device performance with respect to signal propagation delay.

Again referring to FIG. 1a, in particular the gate length of the first and second semiconductor elements 110 and 130 determines the channel length of these devices and, therefore, as previously pointed out, significantly affects the electrical characteristics of the first and second semiconductor elements 110 and 130, whereby a reduced gate length will result in an increased resistance of the gate electrodes 115, 135 owing to the reduction of the cross-sectional area of the gate electrodes 115, 135.

A typical process flow for forming the semiconductor structure 100 may comprise the following steps. After formation of the shallow trench isolations 113 and 133 by well-known photolithography techniques, implantation steps are performed to create a required dopant concentration in the active regions 112 and 132. Subsequently, the gate insulation layers 118 and 138 are formed according to design requirements. Thereafter, the gate electrodes 115 and 135 are formed by patterning, for instance a polysilicon layer, by means of sophisticated photolithography and trim etch methods. Then, a further implantation step for forming so-called source and drain extensions within the source and drain region 114 and 134 is performed and the spacer elements 116 and 126 are formed by deposition and anisotropic etching techniques. The spacer elements 116 and 126 are used as an implantation mask for a subsequent implantation step in which dopant particles are implanted into the source and drain regions 114 and 134 to create the required high dopant concentrations in those regions. It is to be noted that the dopant concentration varies in FIG. 1a in the horizontal direction, i.e., in the length direction of the gate electrodes 115, 135, as well as in the vertical direction, which will hereinafter be referred to as depth direction. Although the dopant profile of the source and drain regions 114 and 134 is depicted as a region having a sharp boundary, in reality the dopant profile varies continuously due to the nature of the implantation process and the subsequent annealing steps that are performed for activating the implanted atoms and for curing the crystalline damage caused by the implantation step. Usually, the dopant profile has to be selected in conformity with other parameters of the first and second semiconductor elements 110 and 130. For example, a short gate length, and thus a short channel length, requires a "shallow" dopant profile in order to avoid the so-called "short channel effect." Accordingly, the peak concentration in the depth direction may be located a few hundred nanometers below the surface of the drain and source regions 114 and 134. Moreover, p-channel transistors may require a different dopant profile than an n-channel transistor element.

As previously noted, the cross-section of the gate electrodes 115 and 135, which may be considered as polysilicon lines, as well as the contact area on top of the source and drain regions 114 and 134, significantly influence the electrical characteristics of the first and second semiconductor elements 110 and 130. Since, generally, these device areas primarily contain a semiconductor material such as silicon in crystalline, polycrystalline and amorphous form, these areas, although they usually include dopants, exhibit a relatively high resistance compared to, for example, a metal line. Consequently, these areas are treated to enhance the conductivity of these regions, thereby improving the overall performance of the devices.

To this end, according to FIG. 1a, a metal layer 140 is deposited over the first and second semiconductor elements 110 and 130. Typically, the metal layer 140 comprises titanium, cobalt or other refractory metals. Subsequently, a first heat treatment, for example, a rapid thermal annealing, is carried out to initiate a chemical reaction between the silicon in the source and drain regions 114, 134, the gate electrodes 115, 135 and the metal contained in the metal layer 140. If, for example, the metal layer 140 substantially comprises cobalt, an average temperature of the first heat treatment may be set to about 400° C. to create a meta-stable cobalt silicon compound exhibiting a relatively high resistivity. Since the silicon contained in the spacer elements 116, 136 and the shallow trench isolations 113, 133 is chemically bound in the form of dioxide or nitride, the metal of the metal layer 140 does not substantially react with the material of the spacer element 115, 136 and the shallow trench isolations 113, 133. After the first heat treatment, the material of the metal layer 140 that has not reacted with the underlying material is removed by, for example, a selective wet etching process. Thereafter, a second heat treatment is performed, for example, a second rapid annealing step with a temperature higher than in the first annealing step, to convert the meta-stable metal-silicon compound into a metal silicide. In the above example, when cobalt is used, a cobalt disilicide is formed in the second annealing step. The metal silicide shows a significantly lower resistance than the meta-stable metal-silicon compound as well as a significantly lower resistance, by a factor of about 5–10, than the sheet resistance of the doped polysilicon.

FIG. 1b schematically shows the finally obtained first and second semiconductor elements 110 and 130 having formed on the respective source and drain regions 114, 134 and the gate electrodes 115, 135 a metal suicide region 141.

Although the metal silicide regions 141 significantly improve the electrical characteristics of the first and second semiconductor elements 110 and 130, there is still room for improvement since, in the conventional process flow, the metal silicide regions 141 have to be formed so as to meet the requirements of the first semiconductor element 110 and the second semiconductor element 130, so that optimizing the characteristics of the silicide regions 141 of the first semiconductor element 110 compromises the effect of the silicide regions 141 of the second semiconductor element 130, and vice verse.

It is thus desirable to have a semiconductor and a method of forming the same in which the characteristics of the conductive semiconductor regions may be individually optimized for different semiconductor elements.

The present invention is directed to a method that may solve, or at least reduce, some or all of the aforementioned problems.

SUMMARY OF THE INVENTION

The present invention is generally related to a method of manufacturing a semiconductor device in which silicon-containing regions receive a metal silicide portion to enhance the electrical properties of these regions, wherein the type of material and/or a thickness of the metal silicide portion is individually adjusted to meet the requirements of different semiconductor regions in view of the electrical resistance.

According to one illustrative embodiment of the present invention, a method of forming a semiconductor device comprises providing a substrate having formed thereon a first and a second conductive silicon-containing region and forming a first resist mask for covering a second conductive silicon-containing region while exposing the first conductive silicon-containing region. Moreover, a first metal layer of a predefined thickness is deposited over the substrate and the first resist mask is removed. Furthermore, the method includes forming a second resist mask for covering the first conductive silicon-containing region and exposing the second conductive silicon-containing region. Thereafter, a second metal layer of a second predefined thickness is deposited over the substrate and then the second resist mask is removed. Additionally, the method includes a heat treatment of the substrate to form a first silicide layer on the first conductive silicon-containing region and a second silicide layer on the second conductive silicon-containing region.

According to a further embodiment, a method of forming a semiconductor device comprises forming a plurality of conductive silicon-containing regions on a substrate. Thereafter, a plurality of different metal layers are sequentially deposited on the substrate using a deposition mask such that each of the plurality of conductive silicon-containing regions is covered by substantially a single metal layer, wherein the metal layers differ from each other by their type of material and/or their layer thickness. The method further comprises annealing the substrate at a first average temperature for a first time interval to form a metal silicon compound on each of the conductive silicon-containing regions and selectively removing excess metal from the substrate. Additionally, the method includes annealing the substrate at a second average temperature for a second time interval to convert the metal silicon compound into a metal suicide portion, wherein at least one of the first and second average temperatures and the first and second time intervals are controlled to adjust a thickness of the metal silicide portions.

According to a further illustrative embodiment, a semiconductor device comprises at least one first conducive silicon-containing region and at least one second conductive silicon-containing region, wherein the first and second conductive silicon-containing regions are formed in a common layer. Moreover, the semiconductor device comprises a first metal silicide portion formed on the first conductive silicon-containing region and a second metal silicide portion formed in the second conductive silicon-containing region, wherein at least one of the first and second metal silicide portions contains a noble metal.

BRIEF DESCRIPTION OF THE DRAWINGS

The invention may be understood by reference to the following description taken in conjunction with the accompanying drawings, in which like reference numerals identify like elements, and in which:

FIGS. 1a and 1b show schematic cross-sectional views of a first and second semiconductor element having a silicide portion formed in conductive areas, wherein the first and second semiconductor elements are manufactured in accordance with a typical prior art process; and FIGS. 2a–2f schematically show cross-sectional views of a semiconductor structure during various manufacturing stages, which is formed in accordance with one illustrative embodiment of the present invention.

Figure 2A:
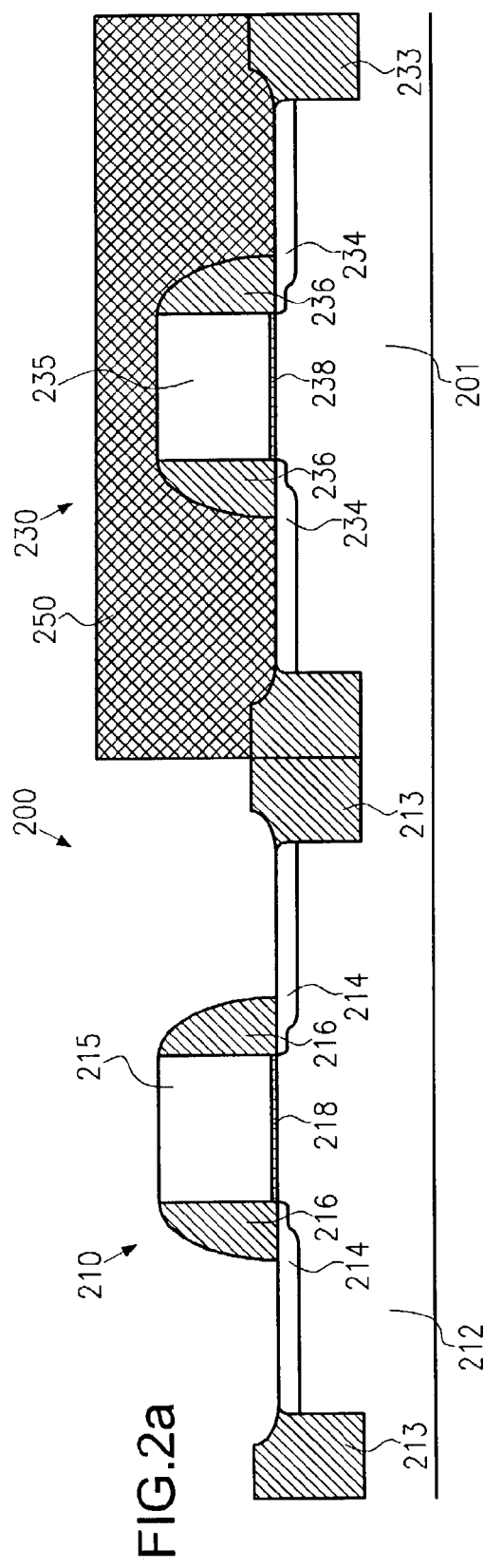

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

With reference to FIGS. 2a–2f, illustrative embodiments of the present invention will now be described, wherein, as previously pointed out, two or more different conductive silicon-containing regions receive a silicide portion, the type of material and/or the thickness of which are correspondingly designed to improve the electrical conductivity of these regions. For example, if it is necessary to obtain a similar signal propagation delay for long silicon lines connecting two different die areas, wherein one of the silicon lines exhibits a larger cross-sectional area than the other one, according to the present invention, different silicide portions are formed on these silicon lines to improve the overall characteristics and to substantially compensate for the different cross-sectional areas. The same applies to different types of transistor elements, such as n-channel transistors and p-channel transistors, that, in general, have a different dopant profile and also a different barrier height that experiences a charge carrier at the interface between the silicided portion and the doped silicon-containing region. In this case, the present invention also allows one to appropriately form corresponding silicide portions in the devices to individually optimize the performance of the devices. Similarly, short channel devices generally require a different type of silicide portion than do long channel devices since, for example, in long channel devices the peak dopant concentration is located more deeply in the drain and source regions than in short channel devices which require relatively shallow junctions. The present invention allows one to individually adjust the overlap of the silicided portion at a depth at which the peak dopant concentration is approximately located so as to obtain a minimum transition resistance for charge carriers, especially when the barrier height of the metal silicide is also selected in conformity with the type of dopants prevailing in the active regions of the transistor devices. Consequently, although in the following detailed description a first and second semiconductor element representing a complimentary transistor pair is referred to, the present invention is to cover all aspects in which silicon-containing regions are required to receive individually adapted silicide portions to improve the performance of the individual semiconductor region or to improve the overall performance of the semiconductor device.

In FIG. 2a, a semiconductor structure 200 comprises a substrate 201, for example, a silicon substrate or any other substrate appropriate for the formation of semiconductor elements. In the substrate 201, a first semiconductor element 210 comprises an active region 212 defined by shallow trench isolations 213. A gate electrode 215 is separated from the active region 212 by a gate insulation layer 218. Spacer elements 216 of an insulating material, such as silicon dioxide or silicon nitride, are formed adjacent to the sidewalls of the gate electrode 215. In the active region 212, source and drain regions 214 are formed.

The semiconductor structure 200 further includes a second semiconductor element 230 comprising substantially the same components as the first semiconductor element 210. Thus, corresponding parts are denoted by the same reference numerals except for a leading "23" instead of a leading "21." It should be borne in mind that, although depicted as being quite similar, the first and the second semiconductor elements 210 and 230 differ from each other in the sense as pointed out above. Moreover, on the second semiconductor element 230, a resist mask 250 is formed.

A typical process flow for forming the semiconductor structure 200 may be quite similar to the processing as described with reference to FIGS. 1a and 1b and, thus, the description of these process steps is omitted. The resist mask 250 may be formed by means of conventional photolithography wherein, however, any overlay considerations are of no great concern since the precise location of the resist mask 250 on the shallow trench isolations 233 is not critical.

Figure 2B:
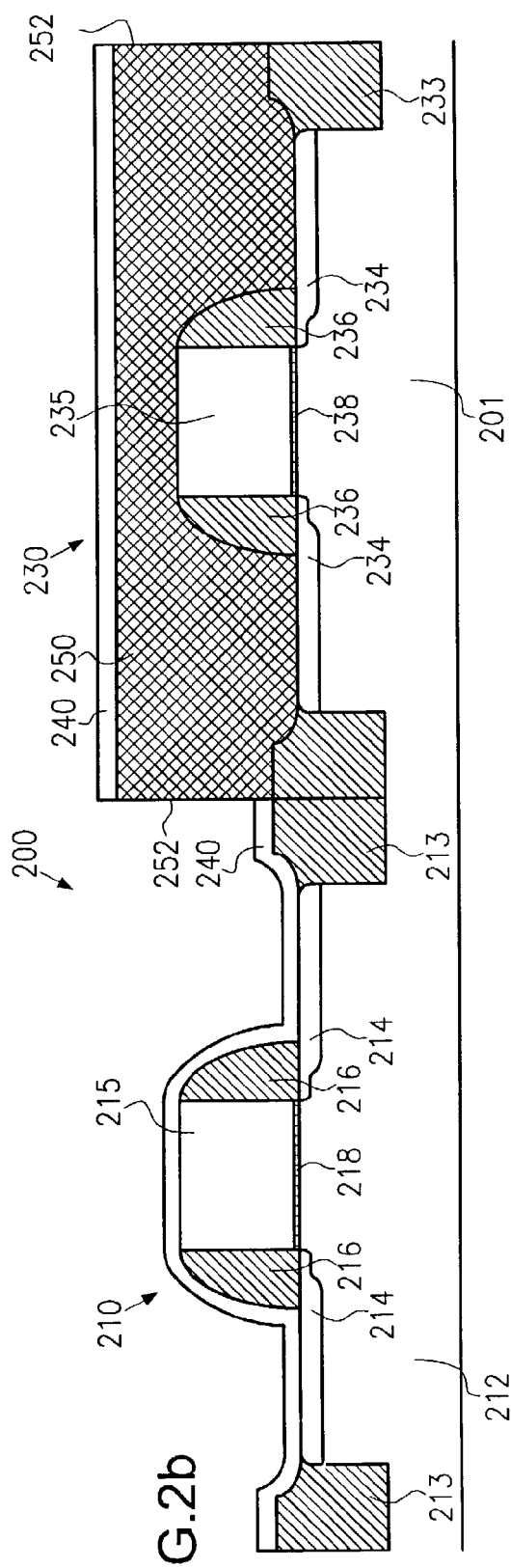

FIG. 2b schematically shows the semiconductor structure 200 with a first metal layer 240 deposited over the semiconductor structure 200. The first metal layer 240 may comprise any refractory metal or compound of metals that is suitable to provide for the required characteristics of the metal silicide to be formed in the silicon-containing regions 214 and 215. Suitable metals may include cobalt, titanium, nickel, tungsten and combinations thereof. In one particular embodiment, the first metal layer 240 may comprise a noble metal such as platinum, palladium, gold and the like. A thickness of the first metal layer 240 and the composition thereof is selected such that in a subsequent annealing step an interdiffusing of silicon and metal atoms takes place and a metal silicide portion may form having a required penetration depth, i.e., a required thickness, and a required barrier height to yield a minimum transition resistance for the charge carriers. For example, a cobalt layer may be deposited with a thickness of 30 to 80 nm. In FIG. 2b, the first metal layer 240 covers a surface of the resist mask 250, whereas sidewall portions 252 of the resist mask 250 remain substantially uncovered. To this end, a deposition technique may be employed that allows one to minimize the coverage of the sidewall portions 252 with metal. For instance, a physical vapor deposition (PVD) technique, such as sputter deposition, may be used wherein process parameters are adjusted so that atoms and ions sputtered off of a target hit the semiconductor structure 200 in a substantially perpendicular direction. Consequently, the deposition of the first metal layer 240 at the sidewall portions 252 is minimized. Hitting the semiconductor structure 200 substantially perpendicularly may be obtained by using a collimator in the sputter deposition chamber in the vicinity of the substrate 201 to "guide" the ions and atoms approaching the substrate 201. The required directionality of the incoming ions and atoms may also be obtained by adjusting the magnetic and electrical fields within the sputter deposition chamber to obtain a minimal step coverage.

Figure 2C:
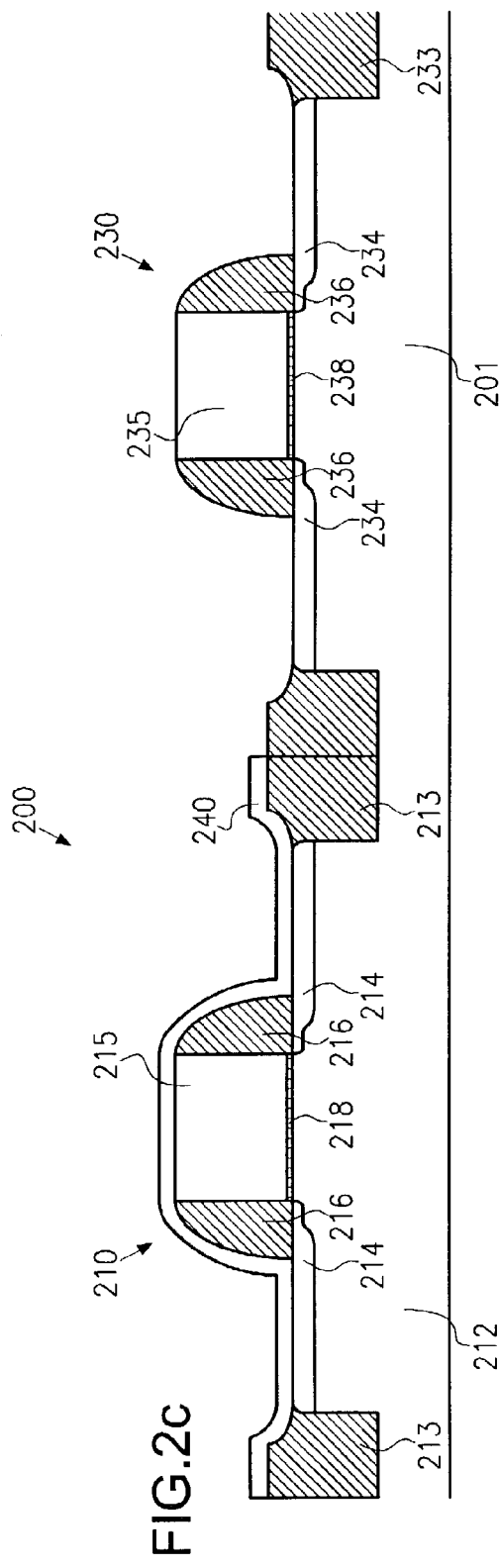

FIG. 2c schematically shows the semiconductor structure 200 with the resist mask 250 and the overlaying first metal layer 240 removed. Removing the resist mask 250 and, thus, portions of the first metal layer 240 over the second semiconductor element 230 may be achieved by a selective wet etching process using a chemical agent having a significantly higher etch rate for the resist mask 250 than for the first metal layer 240. Depending on the degree of coverage of the sidewall portions 252 with metal of the first metal layer 240, the predefined thickness of the initially deposited first metal layer 240 may accordingly be selected so that in the subsequent etching process the thickness of the first metal layer 240 over the first semiconductor element 210 does not remain under a required minimum thickness. If, for example, removing the resist mask 250 takes about 60 seconds and an etch rate of the first metal layer 240 is approximately 10 nm per minute, the initial layer thickness is selected to about 10 nm thicker than at least that required for forming a metal silicide meeting the design requirements. By "underetching" the resist mask 250 from the sidewall portions 252, the mechanical integrity of the first metal layer 240 on top of the resist mask 250 is attacked and the individual parts that split off the first metal layer 240 will be purged away during the process of etching the resist mask 250. Even if the sidewall portions 252 are slightly covered by metal, the resist mask 250 can be removed, although at a prolonged etching time because the metal layer thickness at the sidewall portions is considerably smaller than the thickness of the first metal layer 240 at substantially horizontal surface portions of the substrate 201. Typically, the metal layer thickness at the sidewall portions 252 will not exceed about 10% of the horizontal surface portions. Thus, the first semiconductor element 210 receives a first metal layer 240 that is configured to provide for the required characteristics of a silicide portion to be formed.

Figure 2D:
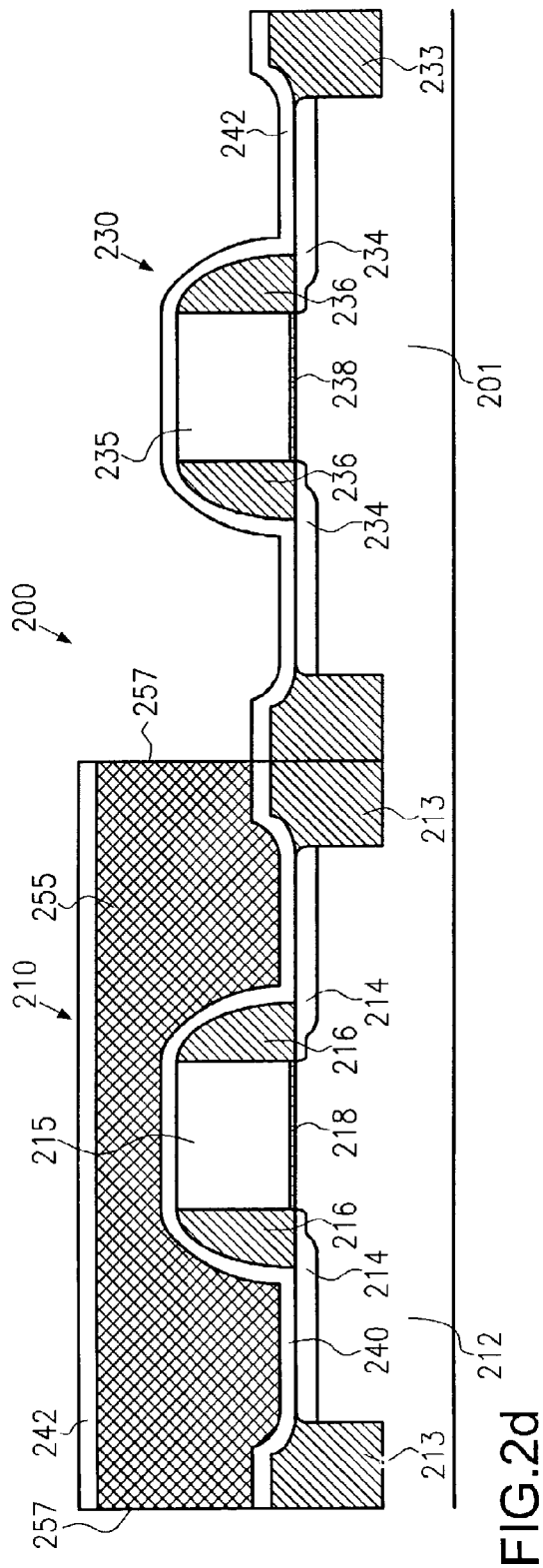

In FIG. 2d, a second photoresist mask 255 is formed over the first semiconductor element 210 and a second metal layer 242 is blanket-deposited over the semiconductor structure 200. Regarding the formation of the second photoresist mask 255, the same criteria apply here as pointed out with reference to the photoresist mask 250. The same is true for the deposition method for forming the second metal layer 242. Also, in this case, sidewall portions 257 of the second photoresist mask 255 are substantially uncovered or at least significantly less covered by metal than the surface portions of the semiconductor substrate 200. Regarding the composition and the thickness of the second metal layer 242, the same criteria as given above apply in this case.

In one embodiment, a plurality of different semiconductor elements may be provided, wherein in subsequent masking steps in each of the plurality of semiconductor elements a different metal layer is deposited. For example, additionally to the resist masks 250 and 255, a further resist mask (not shown) may be provided, wherein the resist masks 250, 255 and the further resist mask are designed such that a third metal layer may be deposited on a third semiconductor element (not shown). This masking sequence may be repeated with suitably designed masks so that a plurality of different metal layers may be deposited on a corresponding plurality of different types of semiconductor elements that are individually optimized to provide for the required silicide portions in these semiconductor elements.

FIG. 2e schematically shows the first and second semiconductor elements 210 and 230 having the first metal layer 240 and the second metal layer 242, respectively. The first and second metal layers 240 and 242 comprise a material and exhibit a thickness, both of which are targeted, when transformed into a metal silicide, to optimize the characteristics of the first and second semiconductor elements 210, 230. In particular, the first metal layer 240 and/or the second metal layer 242 may comprise at least one noble metal.

Subsequently, a heat treatment is performed, for example, a rapid thermal annealing step, to initiate the chemical reaction between the metal in the first and second metal layers 240, 242 and the silicon contained in the regions 214, 234 and 215, 235. In one embodiment, after a first rapid thermal annealing step with a first temperature for a first time interval, diffusion of the atoms of the regions 214, 234, 215, 235 and of the atoms of the first and second metal layers 240, 242 takes place so that a continuous reaction between the silicon and the metal is maintained. The degree of diffusion, and thus of metal-silicon compound, depends on the type of material, the temperature and the duration of the annealing process. Generally, metals having a higher melting temperature tend to show a lower diffusion activity. Thus, the thickness of the metal-silicon compound may be partially adjusted by controlling the first average temperature and the first time interval. Subsequently, excess metal from the surface of the semiconductor structure 200 is removed and a second rapid thermal annealing step may be performed with a second temperature for a second time interval. Typically, the second average temperature is higher than the first temperature to obtain a stable metal silicide having a relatively low electrical resistance. The second average temperature and the second time interval may be controlled to obtain the required sheet resistance in each of the regions 214, 215, 234, 235. It is to be noted that although the first and second metal layers 240, 242 differ from each other, the sheet resistance in the first and second semiconductor elements 210 and 230 may nevertheless be individually adjusted in a common heat treatment since the reaction characteristics of the materials comprising the first and second metal layers 240, 242 are well known and may be selected to yield the desired sheet resistance. Between the first and the second rapid thermal annealing step, the excess metal of the first and second metal layers 240, 242 may be removed by a selective etch process, wherein advantageously metal and metal compounds do not need to be selectively removable with respect to each other. Thus, the non-reacted metal of the first and the second metal layer 240, 242 may be removed in a common etching process. Moreover, no additional heat treatment, compared to the previously described conventional processing, is required and, thus, a "thermal budget" is not incurred.

FIG. 2f schematically shows the finally-obtained semiconductor structure 200, wherein the first semiconductor element 210 comprises first silicide portions 241, the composition and/or the thicknesses of which are adapted to provide for the required sheet resistance in the silicon-containing semiconductor regions 214 and 215. Similarly, the second semiconductor element 230 comprises second silicide portions 243 adapted to meet the specific requirements of the second semiconductor element 230. As previously noted, the first silicide portions 241 and/or the second silicide portions 243 may comprise a noble metal such as platinum, palladium, gold and the like, in combination with refractory metals such as cobalt, titanium, zirconium, tungsten and the like. Moreover, the thickness of the first and second silicide portions 241, 243, that is the degree of "penetration" of the silicide in the depth direction into the region 214, 215, 234 and 235, is adjusted to obtain the required sheet resistance. If, for example, the first semiconductor element represents a p-channel transistor in which the peak concentration of p-type dopants is located at a depth of approximately 200 nm, the thickness, i.e., the penetration, of the silicide portion may be adjusted to about 180–220 nm. Similar considerations apply to an n-channel transistor, which generally exhibits a shallow dopant profile.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a semiconductor device, the method comprising:
   providing a substrate having formed thereon a first and a second conductive silicon-containing region;
   forming a first resist mask for covering the second conductive silicon-containing region and exposing the first conductive silicon-containing region, said first resist mask having a top surface;
   depositing a first metal layer above the first conductive silicon-containing region and across the entirety of said top surface of said first resist mask;
   removing the first resist mask;
   forming a second resist mask for covering the first metal layer above the first conductive silicon-containing region and exposing the second conductive silicon-containing region, said second resist mask having a top surface;
   depositing a second metal layer above the second conductive silicon-containing region and across the entirety of said top surface of said second resist mask;
   removing the second resist mask; and
   heat-treating the substrate to form a first silicide portion in the first conductive silicon-containing region and a second silicide portion in the second conductive silicon-containing region.

2. The method of claim 1, wherein depositing the first metal layer includes controlling the metal deposition such that a step coverage of the first resist mask is minimized.

3. The method of claim 2, wherein the step coverage is minimized by employing a vapor deposition technique in which metal particles hit the substrate substantially perpendicularly.

4. The method of claim 3, wherein a collimator is used to adjust the directionality of metal particles hitting the substrate.

5. The method of claim 2, wherein the step coverage is minimized by sputter depositing the first metal layer while controlling the directionality of the metal particles so as to be substantially perpendicular to the surface of the substrate.

6. The method of claim 1, wherein depositing the second metal layer includes controlling the metal deposition such that a step coverage of the second resist mask is minimized.

7. The method of claim 6, wherein the step coverage is minimized by employing a vapor deposition technique in which metal particles hit the substrate substantially perpendicularly.

8. The method of claim 6, wherein the step coverage is minimized by employing a physical vapor deposition technique including a collimator in the vicinity of the substrate.

9. The method of claim 6, wherein the step coverage is minimized by sputter depositing the second metal layer while controlling the directionality of the metal particles so as to be substantially perpendicular to the surface of the substrate.

10. The method of claim 1, wherein the substrate comprises at least one third conductive silicon-containing region, and wherein the method further includes:
    forming a third resist mask to cover the first and second metal layers and to expose the third conductive silicon-containing region;
    depositing a third metal layer; and
    removing the third resist mask, wherein during the heat treatment a third silicide portion is formed in the third conductive silicon-containing region.

11. The method of claim 1, wherein at least one of a type of metal and layer thickness of the first and second metal layers, temperature and duration of the heat treatment are selected to attain a first and a second sheet resistance in the first and second silicide portions such that the first and second sheet resistances are each within corresponding acceptable ranges.

12. The method of claim 1, wherein at least one of the first and second metal layers comprises a refractory metal.

13. The method of claim 1, wherein at least one of the first and second metal layers comprises at least one of cobalt, titanium, tantalum, zirconium, nickel, tungsten and a combination thereof.

14. The method of claim 1, wherein at least one of the first and second metal layers comprises at least one noble metal.

15. The method of claim 14, wherein at least one of the first and second metal layers comprises one of platinum, palladium and gold.

16. The method of claim 1, wherein heat treating the substrate includes:
   annealing the substrate with a first average temperature;
   removing material of the first and second metal layers that has not reacted with the underlying material; and
   annealing the substrate with a second average temperature, wherein the first average temperature is less than the second average temperature.

17. The method of claim 16, wherein the removing of material of the first and second metal layers that has not reacted with the underlying material includes one of a selective dry etching process and a selective wet etching process.

18. The method of claim 1, wherein removing the first resist mask includes selectively wet etching the first resist mask.

19. The method of claim 1, wherein removing the second resist mask includes selectively wet etching the second resist mask.

20. The method of claim 1, wherein the first conductive silicon-containing region includes at least one n-channel field effect transistor and the second conductive silicon-containing region includes at least one p-channel field effect transistor.

21. The method of claim 1, wherein the first conductive silicon-containing region includes a silicon line having a first cross-section and the second conductive silicon-containing region includes a second silicon line having a second cross-section, the first cross-section differing from the second cross-section.

22. The method of claim 1, wherein the first conductive silicon-containing region differs from the second conductive silicon-containing region in at least one of type of dopants, dopant profile, crystalline structure and composition of material.

23. The method of claim 1, wherein said first and second metal layers differ from each other in at least one of a type of material and a thickness.

* * * * *